(12) United States Patent
Houston (10) Patent No.: US 7,564,725 B2
(45) Date of Patent: Jul. 21, 2009

(54) SRAM BIAS FOR READ AND WRITE (75) Inventor: Theodore W. Houston, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 17 days.

(21) Appl. No.: 11/848,442

(22) Filed: Aug. 31, 2007

(65) Prior Publication Data

US 2009/0059685 A1    Mar. 5, 2009

(51) Int. Cl.
*G11C 5/14* (2006.01)
(52) U.S. Cl. .............. 365/189.09; 365/226; 365/230.06
(58) Field of Classification Search .......... 365/154, 365/156, 189.01, 189.09, 226, 230.06
See application file for complete search history.

(56) References Cited

U.S. PATENT DOCUMENTS

| | | | |
|---|---|---|---|
| 6,795,332 B2 | 9/2004 | Yamaoka et al. | |
| 7,087,942 B2 | 8/2006 | Osada et al. | |
| 7,110,283 B2 | 9/2006 | Takahashi et al. | |
| 7,164,596 B1 * | 1/2007 | Deng et al. | 365/154 |
| 7,385,840 B2 * | 6/2008 | Redwine | 365/154 |
| 2007/0025162 A1 | 2/2007 | Deng et al. | |
| 2007/0076467 A1 | 4/2007 | Yamaoka et al. | |

OTHER PUBLICATIONS

Ted Houston et al., U.S. Appl. No. 11/511,800, "A Memory With Low Power Mode for Write," filed Aug. 29, 2006.

* cited by examiner

*Primary Examiner*—Gene N. Auduong
(74) *Attorney, Agent, or Firm*—Rose Alyssa Keagy; Wade J. Brady, III; Frederick J. Telecky, Jr.

(57) ABSTRACT

An integrated circuit includes a SRAM array including a plurality of SRAM cells arranged in a plurality of rows and columns and having a plurality of word lines and bit lines for accessing rows and columns of cells. A power supply controller has an input operable for receiving an operation signal indicative of whether the array is in a read or write operation. The power supply controller is operable to provide a variable low voltage for the array (VSSM) coupled to a low voltage supply terminal of the array. A level of the VSSM is based on the operation signal, wherein VSSM is at a lower level when in the read operation than when in the write operation. A high voltage supply for said array (VDDM) coupled to a high voltage supply terminal for the array is biased above a word line voltage (VWL) level in the read operation.

31 Claims, 4 Drawing Sheets

SRAM BIAS FOR READ AND WRITE

FIELD OF INVENTION

The present invention relates generally to semiconductor memory devices and more particularly to an improved SRAM cell that uses a combination of circuit assists including different power supply bias conditions for different operations to improve performance.

BACKGROUND

Current trends in the semiconductor and electronics industry require memory devices to be made smaller, faster and require less power consumption. One reason for these trends is that more personal devices are being manufactured that are relatively small and portable, thereby relying on battery power. In addition to being smaller and more portable, personal devices are also requiring increased memory and more computational power and speed. In light of all these trends, there is an ever increasing demand in the industry for smaller, faster, and lower power dissipation memory cells and transistors used to provide the core functionality of these memory devices.

Semiconductor memories can, for example, be characterized as volatile random access memories (RAMs) or nonvolatile read only memories (ROMs), where RAMs can either be static (SRAM) or dynamic (DRAM) differing mainly in the manner by which they store a state of a bit. An SRAM is typically arranged as a matrix of memory cells fabricated in an integrated circuit chip, and address decoding in the chip allows access to each cell for read/write functions. The basic CMOS SRAM cell generally includes two n-type or n-channel (nMOS) pull-down or drive transistors and two p-type (pMOS) pull-up or load transistors in a cross-coupled inverter configuration, with two additional NMOS select or pass-gate transistors added to make up a standard double-sided or differential six-transistor memory cell (a DS 6T SRAM cell, a 6T SRAM cell, or simply a 6T cell). 5 transistor SRAM cells (5T) and 4 transistor SRAM cells (4T) are also known. Additionally, application specific SRAM cells can include an even greater number of transistors, such as 8T and 9T cells. A plurality of transistors are utilized in SRAM requiring matched electrical characteristics to provide predictable cell switching characteristics, reliable circuit performance, and minimize array power dissipation.

Figure 1:
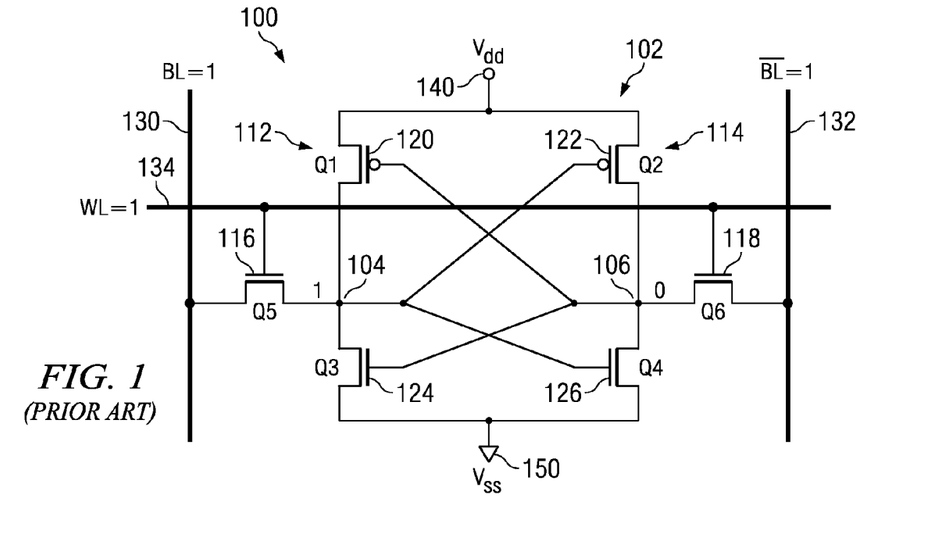
FIG. 1 is a schematic diagram of a conventional differential 6T static random access memory (SRAM) cell.

FIG. 1 is schematic of a conventional differential SRAM 6T cell 100. As illustrated, the SRAM cell 100 comprises a data storage cell or latch 102, generally including a pair of cross-coupled inverters, for example, inverter 112, and inverter 114, the latch 102 operable to store a data bit state. FIG. 1 illustrates that the bit is stored in the latch 102 at the data nodes or first and second latch nodes 104 and 106, respectively, having a high or "1" state and a low or "0" state, respectively. Cell 100 also comprises a pair of wordline pass transistors 116, 118 to read and write the data bit between the cross-coupled inverters 112, 114 and bit lines BL 130, BL-bar 132, when enabled by wordline 134.

Respective inverters 112, 114 comprise a p-type MOS (PMOS) pull-up or load transistor Q1 120, Q2 122 and an n-type (nMOS) pull-down transistor Q3 124, Q4 126. Pass gates (e.g., transistors) Q5 116, Q6 118 are n-channel as well, which generally supply higher conductance as compared to p-channel transistors. Pass transistors 116, 118 are enabled by wordline 134 and accessed by bit lines 130, 132 to set or reset the SRAM latch 100. FIG. 1 further illustrates that inverters 112, 114 of the SRAM memory cell 100 are connected together to a Vdd drain power supply line 140 and a Vss source power supply line 150. Both the Vdd drain power supply line 140 and a Vss source power supply line 150 generally provide fixed voltage levels, such as 1.2 Volts and 0 Volts, respectively.

During conventional read or write operations, bit lines 130 and 132 are initially precharged to a high or "1" state as illustrated. A read voltage is asserted to wordline WL 134 during a read or a write operation to activate (turn-on) pass transistors Q5 116 and Q6 118 into conduction, whereby latch 102 may be accessed by bit lines BL 130 and BL-bar 132, respectively. The wordline voltage when asserted is generally the same as Vdd.

With the prior data states as shown in FIG. 1, an exemplary high state "1" is on a first latch node 104 at the gate of Q4 126, and a low state "0" is on a second latch node 106 at the gate of Q3 124. With these data states, only Q4 126 on the "low side" conducts (is on) and via latch node 106, and pulls bit line-bar 132 lower, while Q3 124 on the "high side" does not conduct (is off) and thus, leaves bit line 130 high. Thus, given a finite amount of time, the cell will increasingly establish a greater differential voltage between the bit lines 130 and 132 which can be sensed by a suitable sensing structure.

In general, SRAM cells are more stable and have better data retention where the respective pMOS (120, 122) and nMOS (124, 126) transistors are balanced and matched within the two inverters (112, 114). However, as dimensions are reduced to scale down devices, it becomes increasingly difficult to achieve a balance in the relative strengths (e.g. drive current capability) of the pass gate, drive, and load transistors over the desired range of temperature, bias conditions, and process variations, as well as achieving matched transistor characteristics. As a result, SRAM cells formed as such can be adversely affected by varying operating characteristics and may be unstable and may not be able to retain the desired bit state, during either or both the read or write operations.

Moreover, as transistor scaling trends continue, it becomes increasingly difficult to design an SRAM cell that has both adequate SNM, adequate Vtrip, and also can endure read and write operations over the desired operating range of temperature, bias conditions, and process variations. As known in the art, Vtrip is essentially a measure of the ability of a cell to be written into, and there is an interdependency between SNM and Vtrip in SRAM cell design. For example, if the pass gate is too strong relative to the drive transistor, SNM is degraded. If the pass gate is too weak relative to the drive transistor, Vtrip is degraded. Also, if the load transistor is too weak relative to the drive transistor, SNM is degraded.

Therefore, whatever generally improves SNM, also degrades Vtrip, and vice versa. With technology scaling to the 45 nm node and beyond, it may no longer be possible to achieve a balance in the relative strengths of the pass gate, drive, and load transistors over the desired range of temperature and bias conditions as well as process variations. Thus, with the increasing random variation of transistor characteristics with scaling, it is increasingly difficult to design an SRAM cell. Such challenges lead to consideration of circuit assists to improve SNM, Vtrip, and the read current (Iread). Unfortunately, these parameters have conflicting requirements. For example, assists that improve SNM generally degrade Vtrip, while assists that generally improve Vtrip degrade (Iread). Accordingly, there is a need for an improved SRAM cell design that is compatible with technology scaling to the 45 nm node and beyond, which that largely overcomes the performance tradeoffs and provides good performance during all operating conditions for SNM, Vtrip and Iread.

SUMMARY

This Summary is provided to comply with 37 C.F.R. §1.73, requiring a summary of the invention briefly indicating the nature and substance of the invention. It is submitted with the understanding that it will not be used to interpret or limit the scope or meaning of the claims.

An integrated circuit includes an SRAM array comprising a plurality of SRAM memory cells arranged in a plurality of rows and columns, the array also having a plurality of word lines for accessing rows of cells and a plurality bit lines for accessing columns of cells. A power supply controller has an input operable for receiving an operation signal indicative of whether the array is in a read or write operation, and optionally whether the array is in standby or a slow read. The power supply controller is operable to provide a variable low voltage for the array (VSSM) coupled to a low voltage supply terminal of the array. A level of VSSM is based on the operation signal, wherein VSSM is at a lower level when in the read operation as compared to a higher level when in the write operation. A high voltage supply for the array (VDDM) coupled to a high voltage supply terminal for the array is biased above a word line voltage (VWL) level in the read operation. As used herein, unless indicated otherwise, "higher" and "lower" as applied to differences in voltage levels generally refers to a difference of at least 0.02 volts, and in one embodiment at least 0.05 volts, and another embodiment at least 0.1 volts, such as 0.1 to 0.3 volts.

In one embodiment, VDDM is above VWL during the write operation. It is noted that for approaches that have no interleaving of words in a row (no half-addressed cells to upset), this embodiment is not needed.

In one embodiment, the power supply controller is programmable. In another embodiment the memory cells each include first and second cross-coupled inverters, the first inverter having a first latch node and the second inverter having a second latch node, and one or more pass transistor coupled to at least one of the latch nodes. One of the word lines are connected to a gate of the pass transistor and one of the bit lines connected to a source or drain of the pass transistor. At least one controller is operable for selectively driving the plurality of word lines to VWL and for selectively driving the plurality of bit lines to a bit line voltage (VBL).

In another embodiment, VSSM can be at a first higher level which is above the lower level when the array is not active. In this embodiment, VSSM can float up to said first higher level from the lower level after conclusion of the read operation. The first higher level can comprise the higher level. In one embodiment, VDDM is set at a level above a nominal voltage for a technology used to fabricate the integrated circuit or above a maximum voltage nominally allowed by reliability for the technology.

The power supply controller can also be operable to control VDDM to provide a variable VDDM for the array. In this embodiment, the variable VDDM is reduced for the write operation relative to the read operation. The variable VDDM can be reduced only for selected columns of the array.

In another embodiment in the read operation the bit lines can be precharged to a logic voltage, wherein the logic level is less than the VDDM level in the read operation. The logic level can be the same level as the VWL level. In another embodiment, a slow mode is used so that VSSM stays up for a slow mode read operation.

A method of operating an SRAM memory cell of an array comprising a plurality of SRAM memory cells arranged in a plurality of rows and columns, the array also having a plurality of word lines for accessing rows of cells and a plurality of bit lines for accessing columns of cells, the method comprising the step of setting a VDD array high voltage (VDDM) above a word line voltage (VWL) for the array for read operations. The array low voltage power supply (VSSM) is dynamically switched to provide a lower VSSM level in the read operation as compared to a higher VSSM level in a write operation. In one embodiment, VDDM is above VWL during the write operation. In another embodiment, when the array is not active VSSM is at a first level which is above the lower VSSM level used in the read operation. The method can further comprise the step of floating up VSSM from the lower level to the first level after conclusion of said read operation. The first level can comprise the higher VSSM level.

The method can further comprise the step of controlling VDDM to provide a variable VDDM for the array. In this embodiment, the method can further comprise the step of reducing the variable VDDM during the write operation relative to the read operation. The variable VDDM can be reduced only for selected columns of the array.

The method can further comprise the step of precharging the bit lines to a logic voltage in the read operation, wherein the logic level is less than VDDM in the read operation, such as precharging to the VWL level. In another embodiment, a slow mode is used so that VSSM stays up for a slow mode read operation.

In one embodiment of the invention, a memory array comprises a plurality of SRAM memory cells arranged in a plurality of rows and columns, the array also having a plurality of word lines for accessing rows of cells and a plurality bit lines for accessing columns of cells. The memory cells each include first and second cross-coupled inverters, the first inverter having a first latch node and the second inverter having a second latch node. One or more pass transistor are coupled to at least one of the latch nodes, one of the word lines being connected to a gate of the pass transistor and one of said bit lines connected to a source or drain of the pass transistor. At least one controller has an input operable for receiving an operation signal indicative of whether the array is in a read or write operation for selectively driving the plurality of word lines to a word line voltage (VWL) and for selectively driving the plurality of bit lines to a bit line voltage (VBL). A power supply controller has an input operable for receiving an operation signal indicative of whether the array is in a read or write operation. The power supply controller is operable to provide a variable low voltage for said array (VSSM) which is coupled to a low voltage supply terminal for the array. A level of VSSM is based on the operation signal, wherein VSSM is at a lower level when in the read operation as compared to the write operation. A high voltage supply for the array (VDDM) coupled to a high voltage supply terminal for the array is also biased above the VWL level in both read and write operations. In one embodiment, the power supply controller is operable to control VDDM to provide a variable high voltage for said array (VDDM). The memory cells can comprise differential 6T cells.

BRIEF DESCRIPTION OF THE DRAWINGS

A fuller understanding of the present invention and the features and benefits thereof will be accomplished upon review of the following detailed description together with the accompanying drawings, in which.

DETAILED DESCRIPTION

The present invention will now be described with reference to the attached drawings, wherein like reference numerals are used to refer to like elements throughout. The invention provides an improved SRAM array structure comprising a plurality of SRAM cells. The SRAM cells can be dual or single sided of various arrangements, including 10T, 8T, 7T, 6T, 5T and 4T. The array is operated with a VDD array voltage (VDDM) which is biased above the word line voltage (VWL). A write bias condition during a write operation and a read bias condition during a read operation are performed at different bias conditions based on a variable array low voltage power supply (VSSM) that is kept at a higher level for write operations as compared to read operations. The present invention also includes a related method of operating SRAM arrays.

The present Inventor has appreciated that setting VDDM higher than VWL improves SNM, but would degrade Vtrip. To improve Vtrip, VSSM is raised for write operations as compared to VSSM for read operations. The higher VSSM for write has been found to be important for performance because since the other modification according to the present invention (VDDM>VWL) would otherwise generally degrade Vtrip too much. For SRAM cells having NMOS pass gates and pull down transistors and PMOS pull-up transistors, a raised VSSM is generally acceptable for SNM because of back bias effects increasing Vtn, but if VSSM is held high in read it would generally degrade Iread. Use of a lower VSSM for read avoids the degradation of Iread. It has thus been found by the present Inventor that the higher bias of VDDM as compared to VWL helps SNM, while operation dependent dynamic switching of the VSSM level helps maintain good performance for both Vtrip and Iread.

In one embodiment of the invention the dynamically switchable VSSM bias is applied to the entire array. However, using well known address decoding, bias conditions according to the present invention can be applied to selected rows or selected columns of the memory array (See integrated circuit 600 shown in FIG. 6 described below which implements bias conditions to selected rows or selected columns of the memory array).

Figure 2:
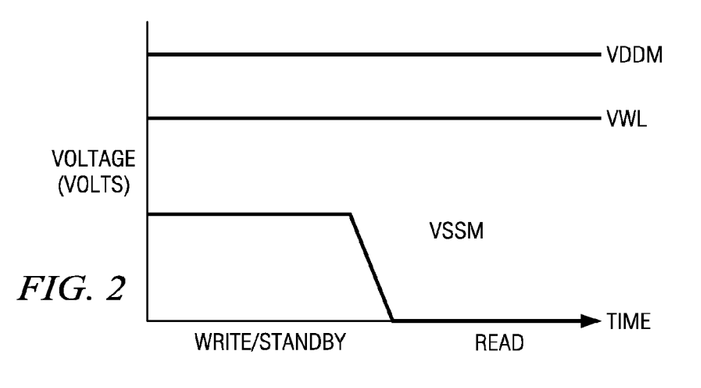
FIG. 2 shows graphs of VDDM, VWL, and VSSM through a write/standby operation, and a read operation, according to an embodiment of the present invention.

FIG. 2 provides graphs showing exemplary levels of VDDM, VWL, and VSSM through a write/standby operation, and a read operation, according to an embodiment of the present invention. Although the bias conditions for write and standby are shown as being the same, the present invention is not limited to this arrangement. The differential bias between VDDM and VWL (VDDM>VWL) improves SNM and minimizes power, and the dynamic switching of VSSM from a relatively high (more positive) level while in write and standby as compared to a relatively low (more negative) level in read helps Vtrip and Iread.

In one embodiment, VWL is generally set at a nominal high voltage for the technology (or highest voltage nominally allowed by reliability), and VDDM is set even higher, such as 0.1 to 0.3 volts higher. The higher VDDM can be allowed if the higher voltage is not across transistors in the cell when they are switching. As known in the art, transistor switching within the cell occurs within write operations but not within read operations, nor in standby. In the case VDDM is set above a nominal high voltage for the technology or highest voltage nominally allowed by reliability (Vmax), the voltage across the transistors during a write operation is acceptable if VSSM is raised by an amount equal to or greater than the amount that VDDM is above Vmax. In other words, VDDM>Vmax is acceptable for reliability if (VDDM−VSSM)<Vmax during a write operation. Using power supply controllers described below, VSSM can be switched to accomplish desired operation dependent VSSM, as well as other bias levels.

Alternatively, a lower VWL can be used as so that although VDDM>VWL is maintained, VDDM is at a level that is at or below the nominal high voltage for the technology or highest voltage nominally allowed by reliability for the technology. A tracking power supply can be used to set a designated differential voltage between VDDM and VWL. Alternatively, VDDM and VWL can be controlled independently with targeted values of VDDM>VWL. As an example, VWL can be clamped at a value<VDDM.

Regarding power considerations, while in standby, VSSM can remain at a raised level relative to a VSSM level for read, such as at the same level used for write operations. A suitable power supply controller, such as controller 305 described below relative to FIG. 3, can let VSSM drift up after a read so as to minimize power, with a provision to rapidly raise VSSM to the target value for write upon initiation of a write operation to avoid a delay in write. In one embodiment, a pulse is applied to raise VSSM at the initiation of a write operation, for example, using circuit 500 shown in FIG. 5 described below. The BL (bit line) can also be precharged at a logic voltage which is below VDDM. Typically, a minimum value for BL precharge is VWL−Vtn of the pass gate.

A slow mode in which VSSM stays up for read can be used to further save power. As used herein, a "slow read" mode can refer to a slow clock (slow as compared to a faster clock provided on the circuit for the other clocked operations), or a read operation that takes place over a plurality of a clock cycles (multi-cycle read). In this embodiment, the read current will be reduced if VSSM is not lowered, resulting in a slow establishment of a signal on the BL for read. This is generally not acceptable for a normal read cycle. However, if the system has a slow read mode, VSSM can be left high for the duration and thus save power.

The present Inventor has also appreciated that it is desirable to have an increased read current (an improved read bias condition), and that the read current may be increased by increasing the total supply voltage to the array, or in one embodiment to a subset of the array comprising the selected cell(s) of the array during the read operation. This increased read bias condition is accomplished by lowering the voltage on the Vss terminal of the selected cell(s) of the array. Limiting the read bias condition to the selected cell(s) requires the least power consumption; however, the read bias may also be applied to the row or column of cells associated with the selected cell, to an associated segment of the array, or the entire array.

Accordingly, the method of the present invention provides VDDM>VWL, and establishes different read and write bias conditions through in one embodiment changing VSSM between read and write, specifically, lowering VSSM to one or more cells in the array, and in one embodiment, to only the selected cells. For standard architectures, to vary VSSM (or VDDM) to less than a sub-array is to supply VSSM (or VDDM) by row or to supply VSSM (or VDDM) by column. For example, in FIG. 6 described below, VDDM is supplied by column and VSSM is supplied by row. The method further comprises the step of establishing a write bias condition during a write operation by raising VSSM to the selected columns of cells. Then, this embodiment of the present invention further comprises accessing the selected cell by raising the WL of the SRAM memory cell by asserting a wordline to the WL during a read or write operation. The bit line(s) to the cell are precharged for a read operation and a voltage is imposed on the bit line(s) to the cell for a write operation. As a result, the static noise margin SNM of the SRAM cell may be improved, and the dynamic switching of VSSM helps Vtrip and Iread. In addition, this arrangement may be useful to reduce power by reducing the bias across unselected cells.

Exemplary implementations are hereinafter illustrated and described in the context of fabricating integrated circuits having SRAM memory including a plurality of SRAM cells, and methods to improve the SNM of an SRAM cell, while maintaining acceptable Vtrip and Iread, particularly in highly scaled memory arrays, wherein the structures illustrated are not necessarily drawn to scale. Although a differential 6T SRAM cell accessed from a pair of bit lines is generally described and illustrated in the context of the present invention, other such cells may also utilize the methods and circuits illustrated herein, and these cells are contemplated. Further, it will be appreciated that the invention may be employed in the fabrication of SRAM memory devices, silicon wafer fabrication and other such fabrication processes in the manufacture of semiconductor memory devices and other such processes apart from the exemplary memory structures described and illustrated herein. These and other benefits will become more apparent as the following figures are described infra.

Figure 3:
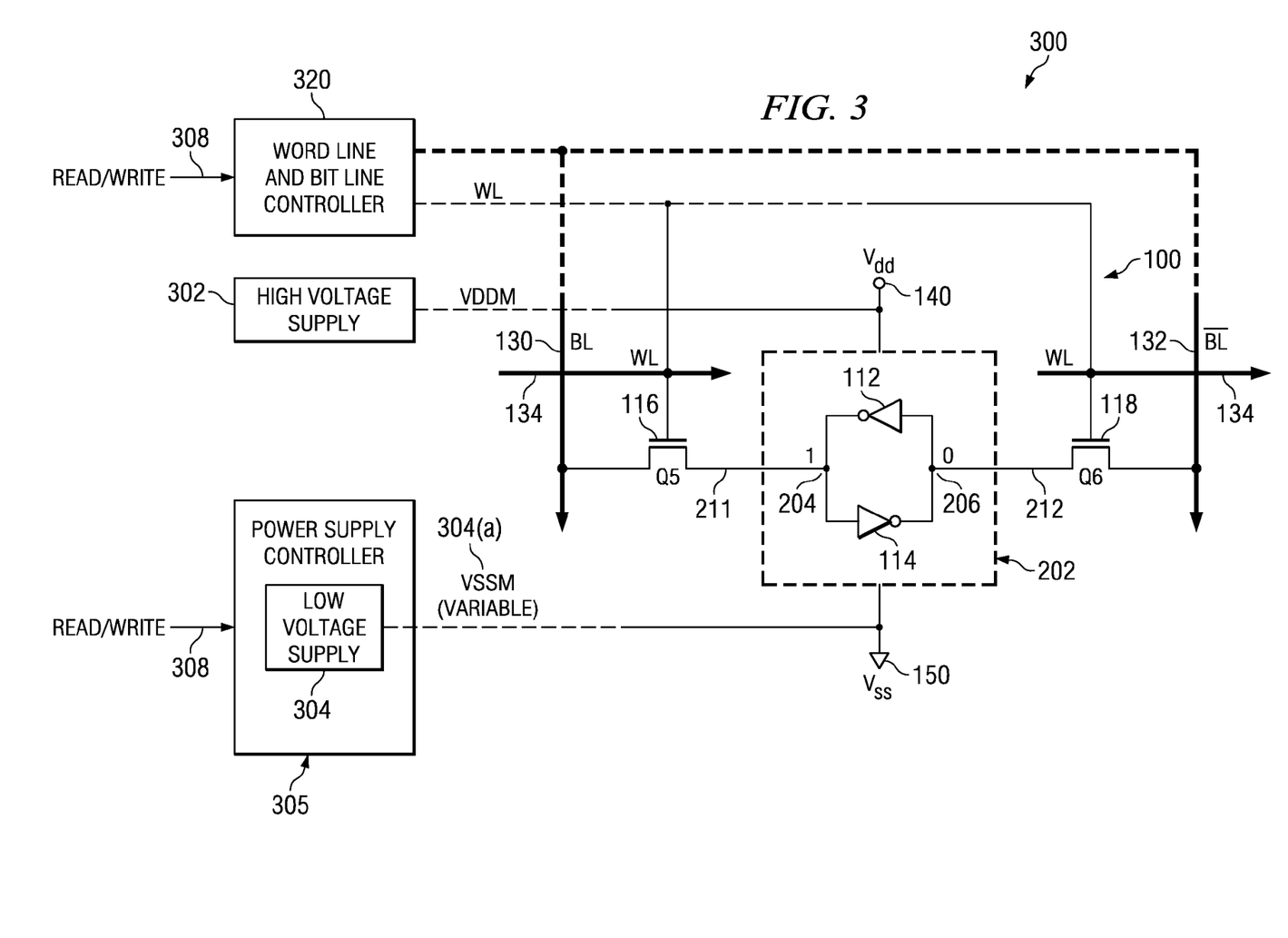
FIG. 3 illustrates an integrated circuit comprising an SRAM array including a plurality of differential 6T SRAM memory cells comprising a power supply controller which receives a read/write operation input and includes associated control circuitry for providing a variable VSSM, such as may be used in accordance with the invention.

FIG. 3 illustrates an integrated circuit 300 showing one SRAM cell 100 of a differential 6T SRAM memory array, along with related circuitry, such as may be used in accordance with the present invention. Compared to the differential 6T SRAM cell 100 of FIG. 1 which lacks a power supply controller, integrated circuit 300 comprises a power supply controller 305 which includes low voltage supply 304 and read/write input 308, and includes associated control circuitry for providing a variable VSSM 304(*a*). Power supply controller 305 can be programmable. VSSM 304(*a*) is coupled to the low voltage terminals of the array Vss 150. 6T SRAM cell 100 as described above relative to FIG. 1 comprises a latch 202 having cross-coupled inverters 112 and 114 with first and second latch nodes 204 and 206, for storing data. The basic latch 202 is similar to latch 102 of cell 100 and as such need not be completely described again for the sake of brevity.

The integrated circuit 300 further comprises high voltage supply VDDM 302 which is coupled to the high voltage terminals of the array Vdd 140. In integrated circuit 300, high voltage supply 302 is not controlled by a power controller. As noted above, power supply controller 305 receives read/write input 308. In response to read/write input indicating a read operation power supply controller 305 provides a lower VSSM (e.g. 0 volts) as compared to the VSSM level set when read/write input indicates a write operation (e.g. 0.2 to 0.3 volts). Thus, the read and write power supply bias conditions are different. These voltages comprise a power supply bias component (VDDM, VSSM (variable)) of the read and write bias conditions used in the read and write operations, respectively. Optionally, these supply voltages in combination with a word line WL 134 voltage/signal and/or a bit line select line voltage/signal from an optional WL and BL controller 320, supply a read bias condition for a read operation and a write bias condition for a write operation of the array, or selected cell(s) thereof.

The high voltage and variable low voltage supplies 302 and 304(*a*), respectively, and/or together with a word line signal on word line WL 134 and/or with a bit line select signal BL 130 and 132, are further operable to supply a read bias condition for a read operation and a write bias condition for a write operation of the array. Indications of the read and write operation, for example, may be supplied by a high and low state on a read/write input 308 to the power supply controller 305. The read and write bias conditions produced by array for the plurality of cells, are operable to provide optimal reading and writing conditions, and improved SNM, read current, and Vtrip. Optionally, either the read or the write condition can be maintained in standby, where the write condition (raised VSSM) would give lower power. Optionally, a separate standby signal can be input to the power supply controller to select a bias condition for standby which may be different from both the read and the write bias conditions.

As noted above, integrated circuit 300 further comprises a word line and bit line select line driver or controller 320 operable to drive the word line WL 134, and the bit lines 130 and 132, respectively, in response to read and write operation indications from read/write input 308. In one option, controller 320 is operable to vary (e.g., boost or reduce) the voltage (s) on the word line 134 and the bit lines 130 and 132. The word line and bit line select line driver, and the high and low voltage supplies (302 and 304(*a*)), or together with the power supply controller 305, are operable to supply a write bias condition to the array during a write operation, and a read bias condition to the array during a read operation, wherein the write bias condition is different from the read bias condition.

During a read operation, and in accordance with one implementation of the invention, the power supply controller 305 may be instructed by the read/write operation input 308 to supply a decreased VSSM voltage 304(*a*) to the source supply terminal Vss 150 for the entire array of cells, or only to the column(s) or row(s) of cells associated with the selected cell(s) of the array.

Similarly, during a write operation, for example, the power supply controller 305 may be instructed by the read/write operation input 308 to supply an increased (more positive) VSSM voltage 304(*a*) to the source supply terminal Vss 150 for the entire array of cells, or only to the column(s) or row(s) of cells associated with the selected cell(s) of the array.

Figure 4:
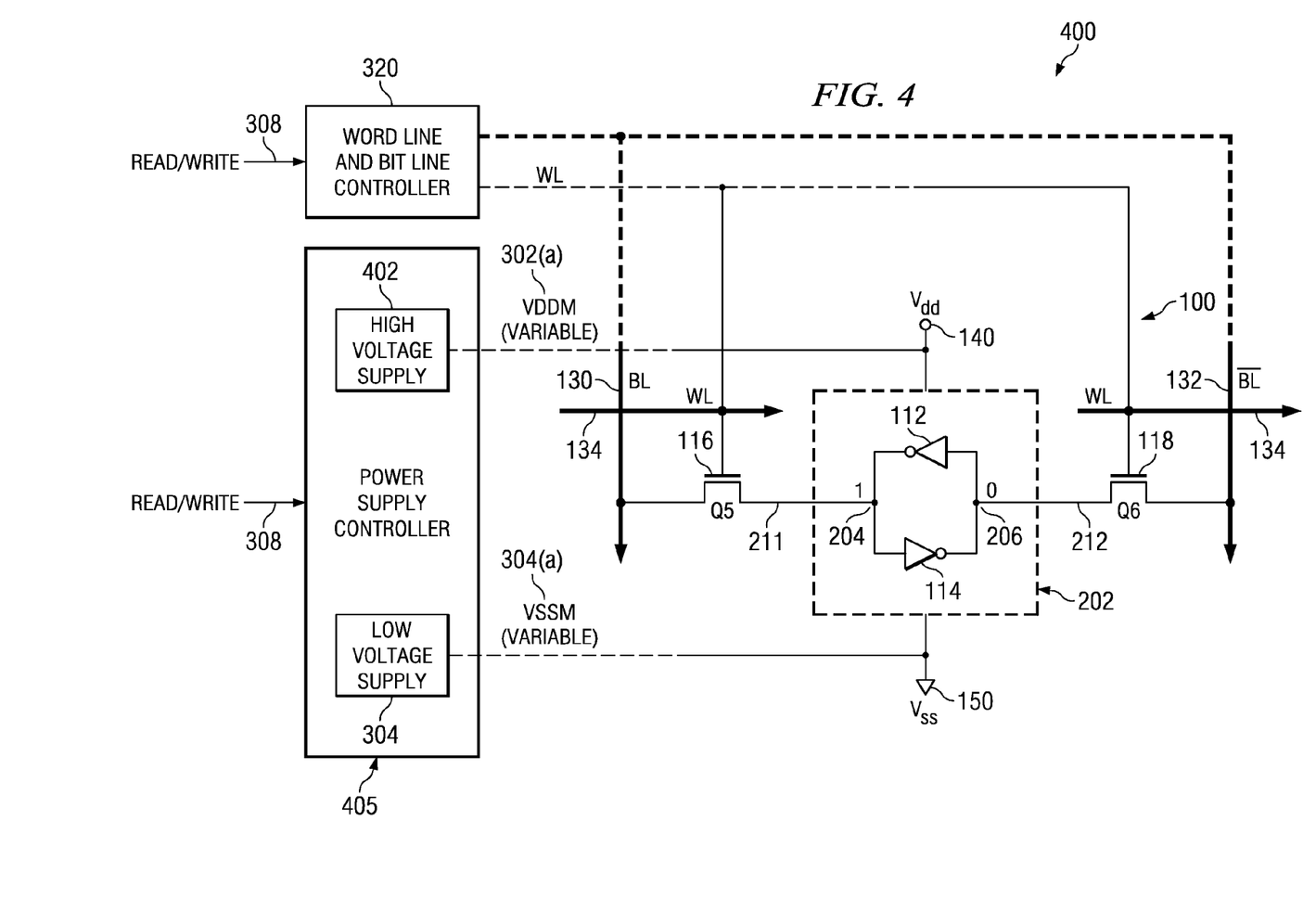
FIG. 4 illustrates an integrated circuit comprising an SRAM array including a plurality of differential 6T SRAM memory cells comprising a power supply controller which receives a read/write operation input and includes associated control circuitry for providing a variable VSSM and variable VDDM, such as may be used in accordance with the invention.

Optionally, a power supply controller according to the invention can be provided to also control the high voltage supply 302 to provide both a variable low voltage supply and a variable high voltage supply. In one embodiment a single power supply controller provides both a variable VSSM and a variable VDDM. FIG. 4 illustrates an integrated circuit 400 showing one SRAM cell 100 of a differential 6T SRAM memory array, along with related circuitry, such as may be used in accordance with the present invention. Compared to integrated circuit 300 shown in FIG. 3, integrated circuit 400 comprises a power supply controller 405 that includes both a low voltage supply 304 and a high voltage supply 302 and power supply control circuitry for providing a variable VSSM 304(*a*) and a variable VDDM 302(*a*). Although shown as a single controller, separate controllers can be used for providing variable VSSM 304(*a*) and variable VDDM 302(*a*). In typical operation, controller 405 receives the read/write input 308, and is operable to provide both a variable VDDM 302(*a*) and variable VSSM 304(*a*).

Figure 5:
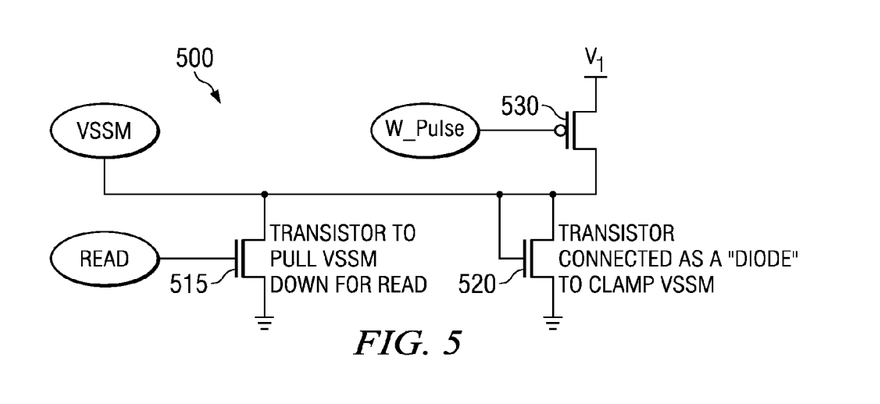
FIG. 5 shows an exemplary circuit according to an embodiment of the invention that uses a pulse that can be used to raise VSSM for write operations.

FIG. 5 shows an exemplary circuit 500 that uses a pulse to raise VSSM for write operations that can be included as a sub-circuit in power supply controller 305 or 405 described above, or power supply controller 610 described below relative to FIG. 6. Circuit 500 can implement dynamic VSSM levels, including operation dependent levels, such as the exemplary levels according to the invention shown in FIG. 2. Circuit 500 includes an nMOS pull down transistor 515, which receives the read voltage at its gate, and in response, pulls VSSM to ground. Nmos transistor 520 is a "diode connected" transistor for clamping VSSM to generally less than 1 volt. Pull-up pMOS transistor 530 is shown receiving W_Pulse, which is a negative going pulse which is triggered on initiation of a write operation. Upon receipt of the W_Pulse, pMOS transistor 530 pulls up VSSM to a voltage V1, provided V1 is less than the clamp voltage set by diode connected Nmos transistor 520, otherwise to the clamp voltage.

Figure 6:
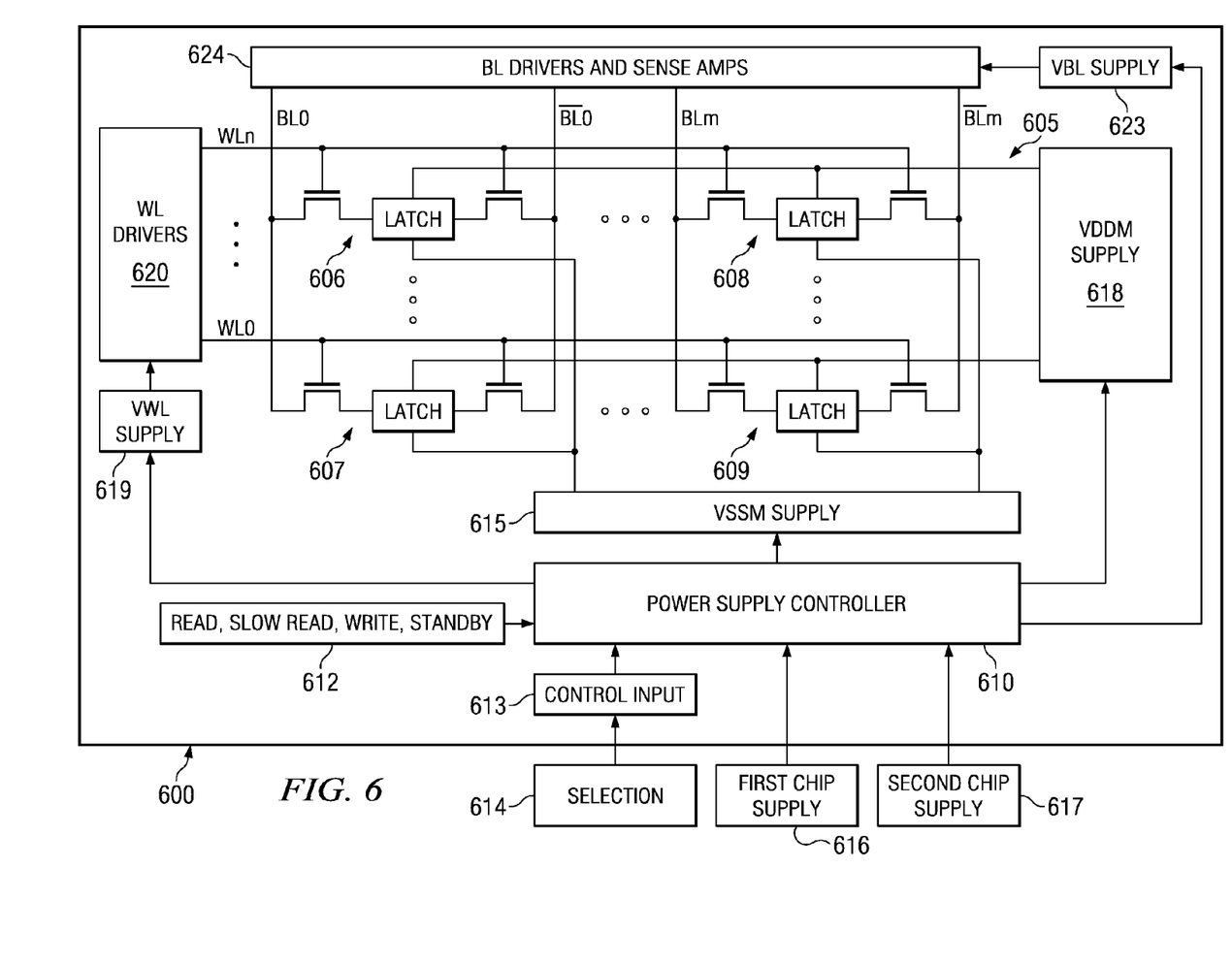
FIG. 6 illustrates an integrated circuit including an SRAM memory array comprising a power supply controller which receives a read, slow read, write and standby operation input and a control input, and includes associated control circuitry for providing a variable VSSM and variable VDDM based on the operation input, wherein the variable VDDM is supplied by column and variable VSSM is supplied by row, such as may be used in accordance with the invention.

FIG. 6 illustrates an integrated circuit 600 according to an embodiment of the invention including an SRAM memory array 605 including a plurality of SRAM cells 606-609. Integrated circuit 600 comprises a power supply controller 610 which receives a read, slow read, write and standby operation input 612 and an optional control input 613. Control input together with off-chip selection input 614 provides programmability to power supply controller 610, such for selecting operational bias voltage levels. Power supply controller 610 is shown receiving an external first (e.g. high) chip supply 616 and second chip (e.g. low) supply 617. Power supply controller 610 also includes associated control circuitry for providing a variable VSSM to thus control VSSM supply 615 based on the operation input 612, which can be embodied as sub-circuit 500 shown in FIG. 5. Power supply controller 610 also includes associated control circuitry for providing a variable VDDM to control VDDM supply 618. The variable VDDM is supplied by column and the variable VSSM is supplied by row.

Power supply controller 610 is shown controlling VWL supply 619, which is coupled to WL drivers 620. Power supply controller 610 is also shown controlling VBL supply 623, which is coupled to BL drivers and sense amps 624.

Cells in the array 605, such as cells 606-609, are thus selected by a cross point of WL and BL (row and column, respectively). One row can be selected (one WL asserted, e.g. WL5) and one or more cells in the row can be selected by column. Accordingly, to vary VSSM or VDDM only to the selected cells is accomplished if all the columns in the selected row are selected and VSSM (or VDDM) is varied by row. Although there are some benefits to interleaving words in a row (not select all columns in a selected row), there may be applications where non-interleaving (selecting all columns in a selected row) provides better performance.

Although the voltage levels of VSSM are generally described as being generated on chip, in another embodiment VSSM supplied externally is switched among levels between read and write operations. Similarly, VDDM and VWL may be supplied separately, one may be generated from the other, or each may be generated from a common supply. As noted above, the power supply controller 610 is being programmable. Generally, a programmable power supply controller according to the present invention may receive input for setting the various voltages, both in terms of magnitude and differences. Such input may be generated on chip or supplied externally, and may be stored or continuously generated.

Although an SRAM cell has been discussed in accordance with the arrays and method of the present invention, it is appreciated by the Inventor that other such cell and transistor technology variations, including array, bit line, or wordline orientation variations are contemplated in the context of the present invention.

The invention is also not limited to the use of silicon wafers, and may be implemented in association with the manufacture of various semiconductor devices, SRAM memory devices, or other such devices, wherein the design and optimization of an SRAM cell, potential data upsets, and power consumption is an issue, where cell access is to be limited only to the memory area being used, and wherein the various aspects thereof may be applied.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and/or the claims, such terms are intended to be inclusive in a manner similar to the term "comprising."

The Abstract of the Disclosure is provided to comply with 37 C.F.R. § 1.72(b), requiring an abstract that will allow the reader to quickly ascertain the nature of the technical disclosure. It is submitted with the understanding that it will not be used to interpret or limit the scope or meaning of the following claims.

What is claimed is:

1. An integrated circuit, comprising:
   a memory array comprising a plurality of SRAM memory cells arranged in a plurality of rows and columns, said array also having a plurality of word lines for accessing rows of cells and a plurality bit lines for accessing columns of cells;
   a power supply controller having an input operable for receiving an operation signal indicative of whether said array is in a read or write operation, said power supply controller operable to provide a variable low voltage for said array (VSSM) coupled to a low voltage supply terminal of said array, a level of said VSSM based on said operation signal, wherein said VSSM is at a lower level when in said read operation as compared to a higher level when in said write operation, and wherein a high voltage supply for said array (VDDM) coupled to a high voltage supply terminal for said array is biased above a word line voltage (VWL) level in said read operation.

2. The integrated circuit of claim 1, wherein said VDDM is at least 0.02 volts above said VWL during said read operation.

3. The integrated circuit of claim 1, wherein said VDDM is above said VWL during said write operation.

4. The integrated circuit of claim 1, wherein said power supply controller is programmable.

5. The integrated circuit of claim 1, wherein said memory cells each include first and second cross-coupled inverters, said first inverter having a first latch node and said second inverter having a second latch node; and one or more pass transistor coupled to at least one of said first latch node and to said second latch node, one of said word lines being connected to a gate of said pass transistor and one of said bit lines connected to a source or drain of said pass transistor; and at least one controller for selectively driving said plurality of word lines to said VWL and for selectively driving said plurality of bit lines to a bit line voltage (VBL).

6. The integrated circuit of claim 1, wherein said VSSM is at a first higher level which is above said lower level when said array is not active.

7. The integrated circuit of claim 6, wherein said lower level is at least 0.02 volts lower than said higher level.

8. The integrated circuit of claim 6, wherein said VSSM floats up to said first higher level from said lower level after conclusion of said read operation.

9. The integrated circuit of claim 8, wherein first higher level comprises said higher level.

10. The integrated circuit of claim 1, wherein said VDDM is set at a level above a nominal voltage for a technology used to fabricate said integrated circuit or above a maximum voltage nominally allowed by reliability for said technology.

11. The integrated circuit of claim 1, wherein said power supply controller is operable to control said VDDM to provide a variable VDDM for said array.

12. The integrated circuit of claim 10, wherein said variable VDDM is reduced for said write operation relative to said read operation.

13. The integrated circuit of claim 12, wherein said variable VDDM is reduced only for selected columns of said array.

14. The integrated circuit of claim 1, wherein in said read operation said bit lines are precharged to a logic voltage, said logic level being less than said VDDM in said read operation.

15. The integrated circuit of claim 14, wherein said bit lines are precharged to said VWL level.

16. The integrated circuit of claim 1, wherein a slow mode is used so that said VSSM stays up for a slow mode read operation.

17. A method of operating an SRAM memory cell of an array comprising a plurality of SRAM memory cells arranged in a plurality of rows and columns, the array also having a plurality of word lines for accessing rows of cells and a plurality of bit lines for accessing columns of cells, said method comprising the steps of:

setting a VDD array high voltage (VDDM) above a word line voltage (VWL) for said array for read operations, and dynamically switching an array low voltage power supply (VSSM) to provide a lower VSSM level in said read operation as compared to a higher VSSM level in a write operation.

18. The method of claim 17, wherein said VDDM is at least 0.02 volts above said VWL during said read operation.

19. The method of claim 17, wherein said VDDM is above said VWL during said write operation.

20. The method of claim 17, wherein when said array is not active said VSSM is at a first level which is above said lower VSSM level in said read operation.

21. The method of claim 20, further comprising the step of floating up said VSSM from said lower level to said first level after conclusion of said read operation.

22. The method of claim 21, wherein first level comprises said higher VSSM level.

23. The method of claim 18, further comprising the step of controlling said VDDM to provide a variable VDDM for said array.

24. The method of claim 23, further comprising the step of reducing said variable VDDM during said write operation relative to said read operation.

25. The method of claim 24, wherein said variable VDDM is reduced only for selected columns of said array.

26. The method of claim 18, further comprising the step of precharging said bit lines to a logic voltage in said read operation, said logic level being less than said VDDM in said read operation.

27. The method of claim 26, wherein said bit lines are precharged to said VWL level.

28. The method of claim 18, wherein a slow mode is used so that said VSSM stays up for a slow mode read operation.

29. A memory array comprising:

a plurality of SRAM memory cells arranged in a plurality of rows and columns, said array also having a plurality of word lines for accessing rows of cells and a plurality bit lines for accessing columns of cells;

wherein said memory cells each include first and second cross-coupled inverters, said first inverter having a first latch node and said second inverter having a second latch node; and one or more pass transistor coupled to at least one of said first latch node and to said second latch node, one of said word lines being connected to a gate of said pass transistor and one of said bit lines connected to a source or drain of said pass transistor; and at least one controller having an input operable for receiving an operation signal indicative of whether said array is in a read or write operation for selectively driving said plurality of word lines to a word line voltage (VWL) and for selectively driving said plurality of bit lines to a bit line voltage (VBL); and a power supply controller having an input operable for receiving an operation signal indicative of whether said array is in a read or write operation, said power supply controller operable to provide a variable low voltage for said array (VSSM) coupled to a low voltage supply terminal for said array, a level of said VSSM based on said operation signal, wherein said VSSM is at a lower level when in said read operation as compared to said write operation, wherein a high voltage supply for said array (VDDM) coupled to a high voltage supply terminal for said array is biased above said VWL level in both said read and said write operation.

30. The memory array of claim 29, wherein said power supply controller is operable to control said VDDM to provide a variable high voltage for said array (VDDM).

31. The memory array of claim 29, wherein said memory cells comprise differential 6T cells.

* * * * *